(12) United States Patent
Suzuki et al.

(10) Patent No.: US 9,048,164 B2
(45) Date of Patent: Jun. 2, 2015

(54) SOLID-STATE IMAGE SENSING DEVICE CONTAINING ELECTRON MULTIPLICATION FUNCTION HAVING N-TYPE FLOATING DIFFUSION (FD) REGION FORMED WITHIN A P-TYPE WELL REGION

(75) Inventors: Hisanori Suzuki, Hamamatsu (JP);
Yasuhito Yoneta, Hamamatsu (JP);
Shin-ichiro Takagi, Hamamatsu (JP);
Kentaro Maeta, Hamamatsu (JP);
Masaharu Muramatsu, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 390 days.

(21) Appl. No.: 12/920,144

(22) PCT Filed: Jan. 27, 2010

(86) PCT No.: PCT/JP2010/051050
§ 371 (c)(1),
(2), (4) Date: Oct. 20, 2010

(87) PCT Pub. No.: WO2010/087372
PCT Pub. Date: Aug. 5, 2010

(65) Prior Publication Data
US 2011/0024854 A1     Feb. 3, 2011

(30) Foreign Application Priority Data
Jan. 30, 2009   (JP) ............... P2009-020927

(51) Int. Cl.
*H01L 27/148*   (2006.01)
*H04N 5/335*    (2011.01)
*H04N 5/372*    (2011.01)

(52) U.S. Cl.
CPC ....... *H01L 27/1485* (2013.01); *H01L 27/14843* (2013.01); *H04N 5/335* (2013.01); *H04N 5/37213* (2013.01)

(58) Field of Classification Search
CPC ............... H04N 5/335; H04N 5/37213; H01L 27/14843; H01L 27/1485
USPC .................. 257/215, 223, 230, 237, 239, 222, 257/E27.154, 155, E29.228
IPC ............... H01L 27/14812, 27/14837, 27/14856, H01L 29/76825
See application file for complete search history.

(56) References Cited

U.S. PATENT DOCUMENTS 5,337,340 A      8/1994  Hynecek
6,140,630 A *   10/2000  Rhodes ...................... 250/208.1
(Continued)

FOREIGN PATENT DOCUMENTS

EP     1 152 469 A2    11/2001
EP     1 688 960       8/2006
(Continued)

*Primary Examiner* — Anh Mai
(74) *Attorney, Agent, or Firm* — Drinker Biddle & Reath LLP

(57) ABSTRACT

A solid state imaging device includes a P-type semiconductor substrate 1A, a P-type epitaxial layer 1B grown on the semiconductor substrate 1A, an imaging region VR grown within the epitaxial layer 1B, and an N-type semiconductor region 1C grown within the epitaxial layer 1B. The solid state imaging device further includes a horizontal shift register HR that transmits a signal from the imaging region VR, and a P-type well region 1D formed within the epitaxial layer 1B. The N-type semiconductor region 1C extends in the well region 1D. A P-type impurity concentration in the well region 1D is higher than a P-type impurity concentration in the epitaxial layer 1B. A multiplication register EM that multiplies electrons from the horizontal shift register HR is formed in the well region 1D.

6 Claims, 8 Drawing Sheets

(56) References Cited

U.S. PATENT DOCUMENTS

| | | |
|---|---|---|
| 6,201,268 B1 * | 3/2001 | Nakashiba .................... 257/239 |
| 6,278,142 B1 | 8/2001 | Hynecek |
| 6,444,968 B1 | 9/2002 | Burt et al. |
| 6,583,558 B1 * | 6/2003 | Suyama et al. ............... 313/542 |
| 6,862,333 B2 | 3/2005 | Kashima et al. |
| 7,190,400 B2 | 3/2007 | Hynecek |
| 7,291,821 B2 | 11/2007 | Robbins |
| 7,420,605 B2 | 9/2008 | Pool et al. |
| 2005/0029553 A1 | 2/2005 | Hynecek |
| 2007/0146521 A1 | 6/2007 | Robbins |
| 2008/0137801 A1 | 6/2008 | Hadfield |

FOREIGN PATENT DOCUMENTS

| | | |
|---|---|---|
| JP | 3-252163 | 11/1991 |
| JP | H4-335573 | 11/1992 |
| JP | H5-211180 | 8/1993 |
| JP | 5-335549 | 12/1993 |
| JP | 2001-127277 | 5/2001 |
| JP | 2002-325720 | 11/2002 |
| JP | 2003-009000 | 1/2003 |
| JP | 2003-051510 | 2/2003 |
| JP | 3862850 | 10/2006 |
| JP | 2007-533130 | 11/2007 |

* cited by examiner

SOLID-STATE IMAGE SENSING DEVICE CONTAINING ELECTRON MULTIPLICATION FUNCTION HAVING N-TYPE FLOATING DIFFUSION (FD) REGION FORMED WITHIN A P-TYPE WELL REGION

TECHNICAL FIELD

The present invention relates to a solid state imaging device with an electron multiplying function.

BACKGROUND ART

A solid state imaging device having a multiplication register is known in the art (see, for example, Patent Documents 1 to 3 mentioned below). In such a solid state imaging device, an electric charge read out from an imaging region is transferred to the multiplication register via a horizontal shift register. The multiplication register typically includes an insulating layer formed on a semiconductor layer, and a transfer electrode formed on the insulating layer. In the multiplication register, in a state that a certain electrode (DC electrode) is fixed by applying a direct current to it, when an electric potential of a next-stage transfer electrode (multiplication electrode) is greatly increased, electron multiplication takes place when an electric charge is transferred between these electrodes.

CITATION LIST

Patent Literature

Patent Document 1: Japanese Patent No. 3862850
Patent Document 2: Published Japanese Translation of PCT International Publication for Patent Application No. 2007-533130.
Patent Document 3: Japanese Patent Application Laid-open No. 2001-127277.

SUMMARY OF INVENTION

Technical Problem

After an in depth investigation of the multiplication register having the above-mentioned configuration, the inventors found that, when a substrate having an epitaxial layer having a high electric resistance is used to enhance the resolution while maintaining a high light sensitivity, practically no electron multiplication is performed.

It is an object of the present invention to provide a solid state imaging device with an electron multiplying function in which electron multiplication is sufficiently performed even when a substrate having an epitaxial layer with a high electric resistance is used.

Solution to Problem

To solve the above-mentioned problems, a solid state imaging device with an electron multiplying function according to the present invention includes a P-type semiconductor substrate; a P-type epitaxial layer grown on the semiconductor substrate; an imaging region formed within the epitaxial layer; a horizontal shift register that includes an N-type semiconductor region formed within the epitaxial layer and that transmits a signal from the imaging region; and a P-type well region formed within the epitaxial layer, wherein the N-type semiconductor region extends in the well region, a P-type impurity concentration in the well region is higher than a P-type impurity concentration in the epitaxial layer, and a multiplication register that multiplies electrons from the horizontal shift register is formed in the well region.

The epitaxial layer is known for its excellent crystalline property. Therefore, when the N-type semiconductor region is formed in the P-type epitaxial layer, electron transfer is performed with a high accuracy; because, electrons in the horizontal shift register are transferred within the semiconductor having an excellent crystalline property. The electrons transferred in this manner enter the multiplication register; however, there is a P-type well region having a relatively higher density than the epitaxial layer that surrounds the multiplication register. The inventors found that, in such a case, a degree of electron multiplication increases significantly because there takes place a precipitous electric potential change right below a transfer electrode of the multiplication register.

It is preferable that the multiplication register includes the N-type semiconductor region that is formed within the well region, an insulating layer formed on the semiconductor region, a plurality of transfer electrodes formed adjacent to each other and on the insulating layer, and a DC electrode that is located between the transfer electrodes and to which a direct electric current is applied.

In other words, because a precipitous electric potential change takes place in the N-type semiconductor region between the DC electrode, to which a direct electric potential is applied, and a next-stage transfer electrode (multiplication electrode), excellent electron multiplication is performed.

It is preferable that the insulating layer includes only a single $SiO_2$ layer. In order to enhance the mechanical resistance and electrical durability of the insulating layer, it was considered that it is preferable that the insulating layer has a two-layered structure including an $Si_3N_4$ layer and an $SiO_2$ layer. However, contrary to the original expectations, a gain of the multiplication register degraded when the two-layered insulating layer was used. On the other hand, an unexpected result was obtained that the gain of the multiplication register did not degrade when the insulating layer had only a single $SiO_2$ layer.

Advantageous Effects of Invention

A solid state imaging device with an electron multiplying function according to the present invention is advantageous in that electron multiplication is sufficiently performed even when a substrate having an epitaxial layer with a high electric resistance is used.

DESCRIPTION OF EMBODIMENTS

Figure 1:
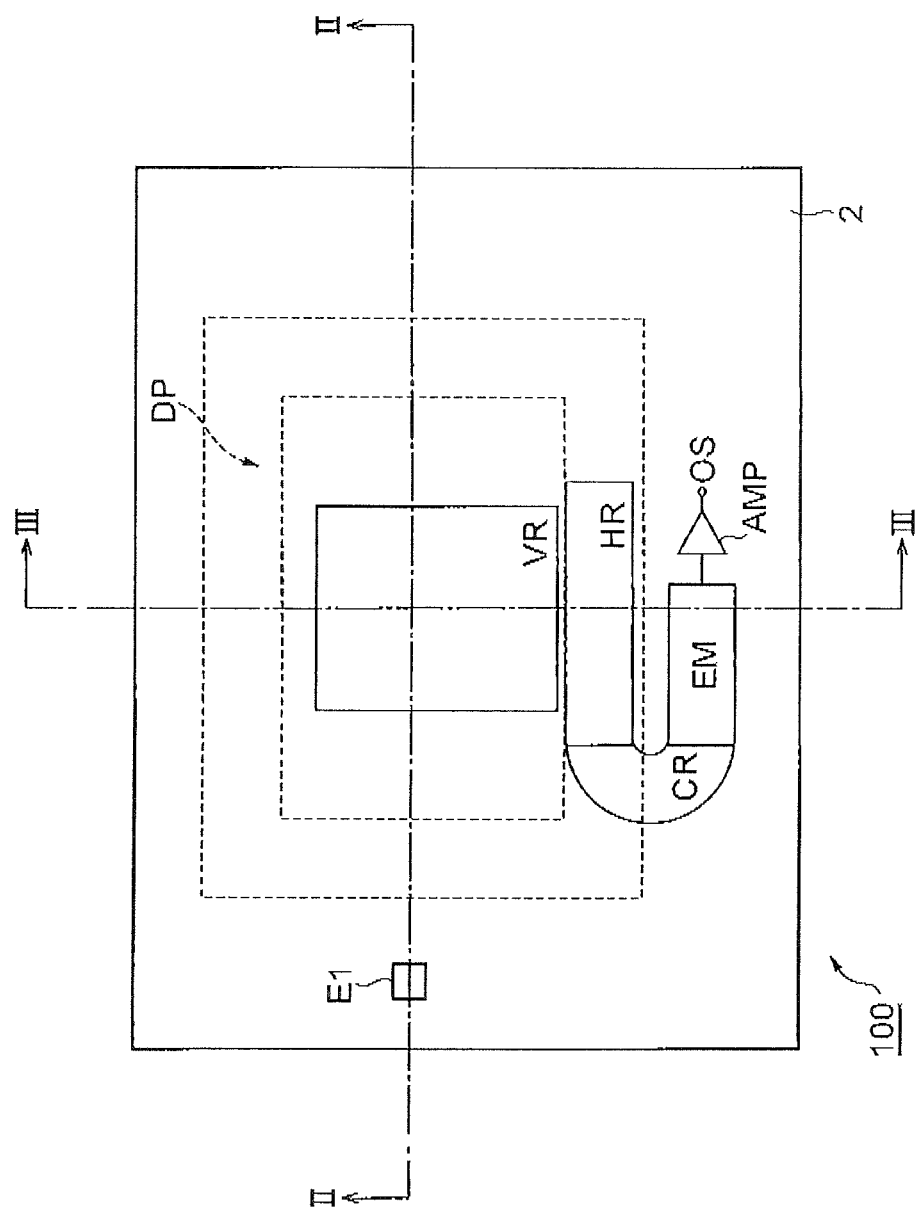
FIG. 1 is a plan view of a solid state imaging device.

A solid state imaging device with an electron multiplying function according to an embodiment is explained below. Like reference numerals are used for like structural elements and overlapping explanation is omitted.

FIG. 1 is a plan view of a back-surface illuminated solid state imaging device 100.

An insulating layer 2 is formed on a semiconductor substrate and a plurality of vertical electric charge transfer electrodes is formed on the surface of the insulating layer 2. These transfer electrodes form a vertical shift register. The region in which the vertical shift register is formed is an imaging region VR. In the present embodiment, the imaging region VR is a CCD imaging region. It is permissible to form the imaging region VR with a MOS imaging sensor.

A horizontal shift register HR is arranged along one side of the imaging region VR. A corner register CR is arranged in an electric charge transfer path between the horizontal shift register HR and a multiplication register EM. The structure of the corner register CR is the same as that of the horizontal shift register HR except that its electric charge transfer direction is bent into an arc-shape. An amplifier AMP is electrically connected to an output end of the multiplication register EM. An image signal obtained at an output end OS of the amplifier AMP is read sequentially pixel by pixel.

A backside of the semiconductor substrate on which the insulating layer 2 is formed is etched in a rectangular shape to form a recessed portion DP. The side on which the recessed portion DP is formed is the backside of the substrate, and an image is incident on a backside of the solid state imaging device.

Figure 2:
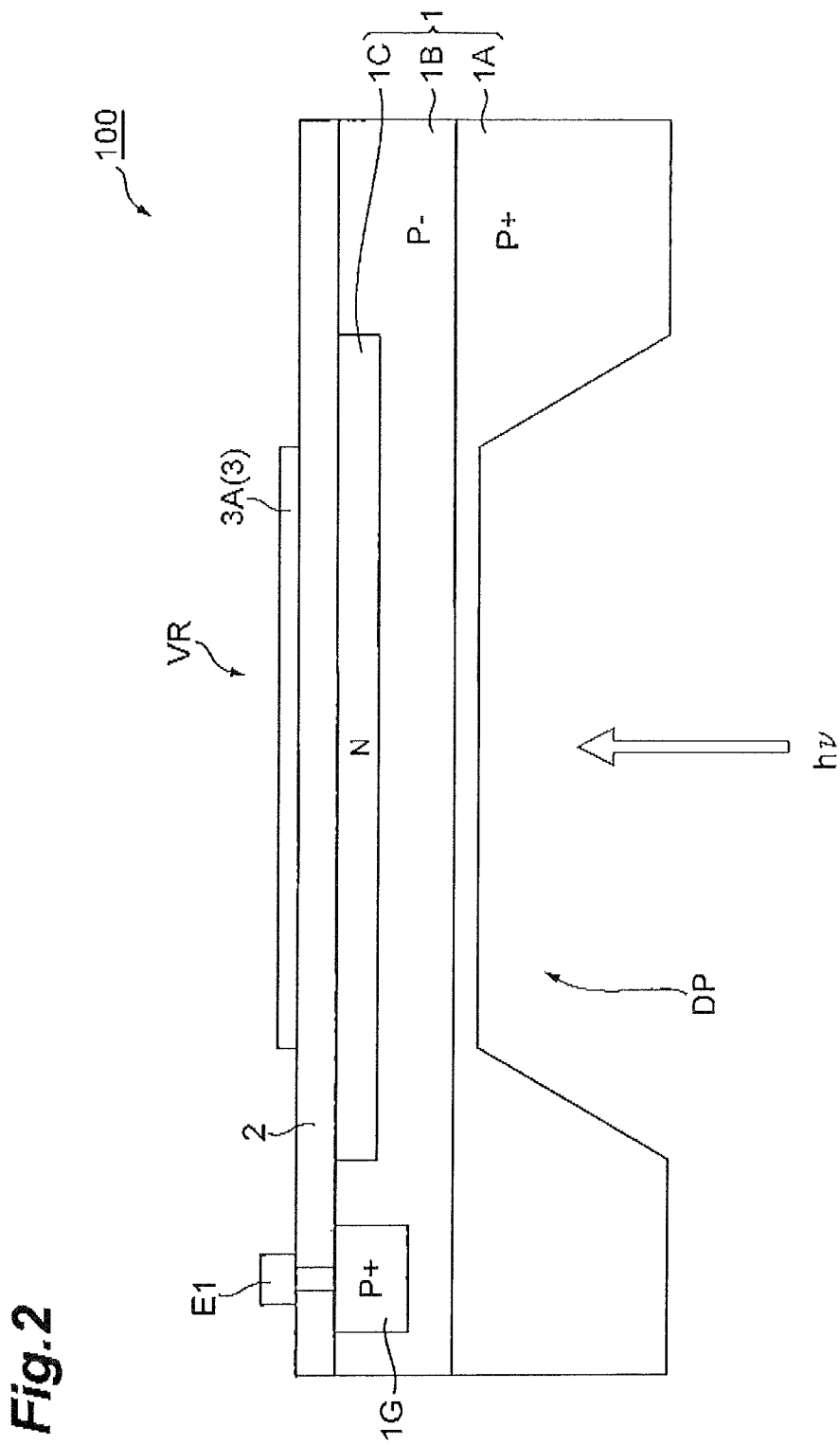
FIG. 2 is a sectional view of the solid state imaging device shown in FIG. 1 along arrows II-II.

FIG. 2 is a sectional view of the solid state imaging device shown in FIG. 1 along arrows II-II.

The solid state imaging device 100 includes a P-type semiconductor substrate 1A, a P-type epitaxial layer 1B grown on the semiconductor substrate 1A, the imaging region VR grown within the epitaxial layer 1B, and an N-type semiconductor region 1C grown within the epitaxial layer 1B. Thus, the solid state imaging device 100 has a structure of an embedded channel-type CCD. An optical image hv is incident from the backside of the substrate. The semiconductor substrate 1A is etched from the backside to form the recessed portion DP. An entire structure including all of the semiconductor substrate 1A, the epitaxial layer 1B, and the semiconductor region 1C is taken as a semiconductor substrate 1. The insulating layer 2 is formed on the semiconductor substrate 1, and transfer electrodes 3 are arranged on the insulating layer 2. A P-type contact region 1G is formed within a portion of the epitaxial layer 1B, and an electrode E1 is arranged within the contact region 1G. Electric potentials of the P-type semiconductor substrate 1A and the epitaxial layer 1B are determined when a reference electric potential such as a ground electric potential is applied to the electrode E1.

Electrons are transferred in the imaging region VR in a direction normal to a plane of the paper on which FIG. 2 is printed. Isolations IS (see FIG. 4) constituting a plurality of P-type semiconductor regions that extend in an electric charge transfer direction are formed within the N-type semiconductor region. These isolations form channels of the vertical shift register; however, to simplify the explanation, the isolations have not been shown in the figure.

Figure 3:
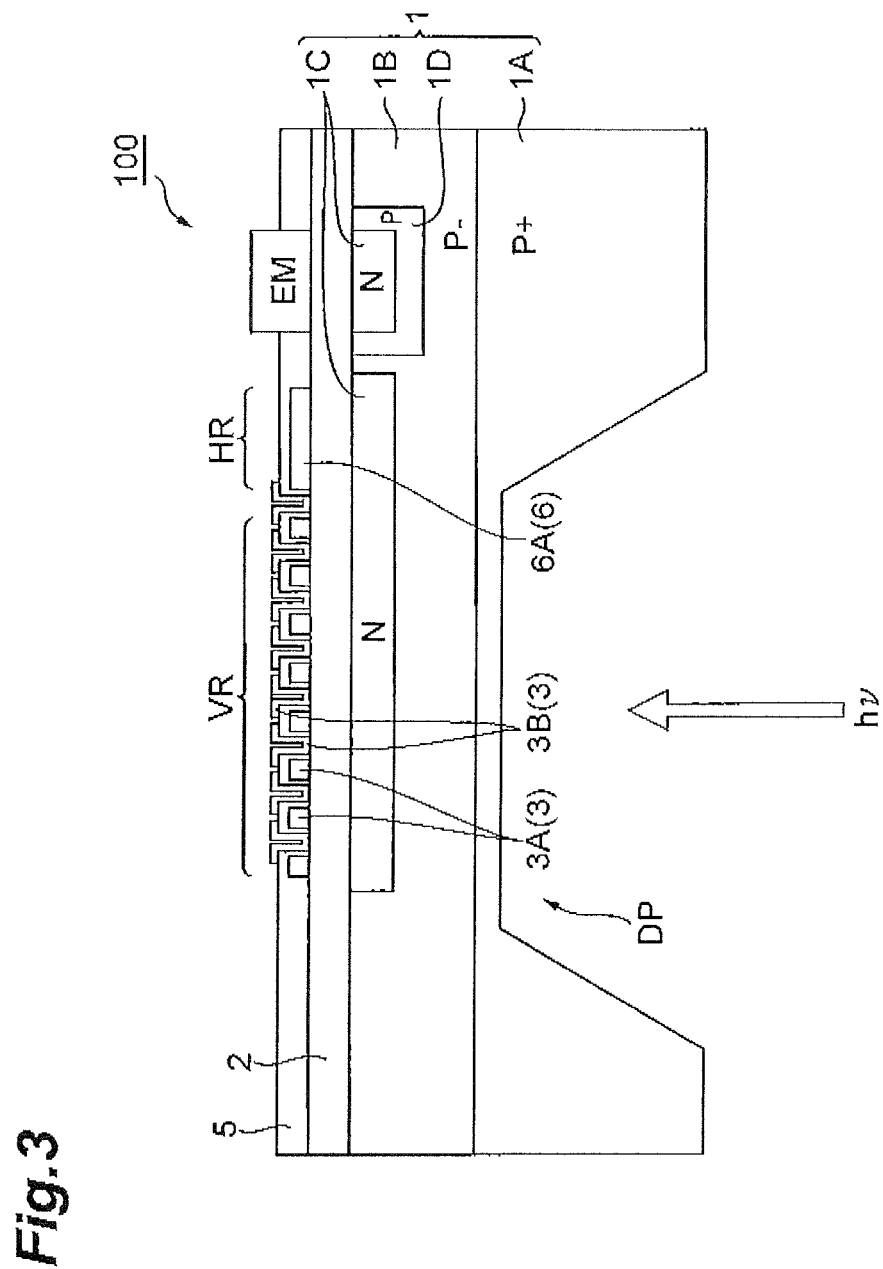
FIG. 3 is a sectional view of the solid state imaging device shown in FIG. 1 along arrows III-III.

FIG. 3 is a sectional view of the solid state imaging device shown in FIG. 1 along arrows III-III.

Transfer electrodes 3A and 3B formed in the imaging region VR are arranged in an alternating manner. Although a portion of these transfer electrodes 3A and 3B is overlapping, an insulating layer 5 is arranged between the adjacent transfer electrodes 3A and 3B. Thus, the transfer electrodes 3A and 3B are electrically separated from each other. A signal output from the imaging region VR is transmitted by the horizontal shift register HR. Moreover, the multiplication register EM is positioned adjacent to the horizontal shift register HR (only an electrode group is schematically shown as EM in this diagram). A P-type well region 1D is formed within the epitaxial layer 1B corresponding to the position of the multiplication register EM. The N-type semiconductor region also extends into the P-type well region 1D. A P-type impurity concentration in the P-type well region 1D is higher than a P-type impurity concentration in the epitaxial layer 1B.

The semiconductor substrate 1 has a thin part where the recessed portion DP is formed and a thick part around the thin part. Carriers generated in the thick part because of incident light annihilate before they reach the surface. Particularly, because a P-type impurity concentration in the semiconductor substrate 1 is substantially higher than the P-type impurity concentration in the epitaxial layer 1B, the traveling distances of the carriers are also short. Each of the horizontal shift register HR, the corner register CR (see FIG. 1), and the multiplication register EM are formed at least in a region that is outside of the thin part, and they are preferably formed in the thick part. Therefore, the carriers generated in the thick part do not mix inside these registers.

Figure 4:
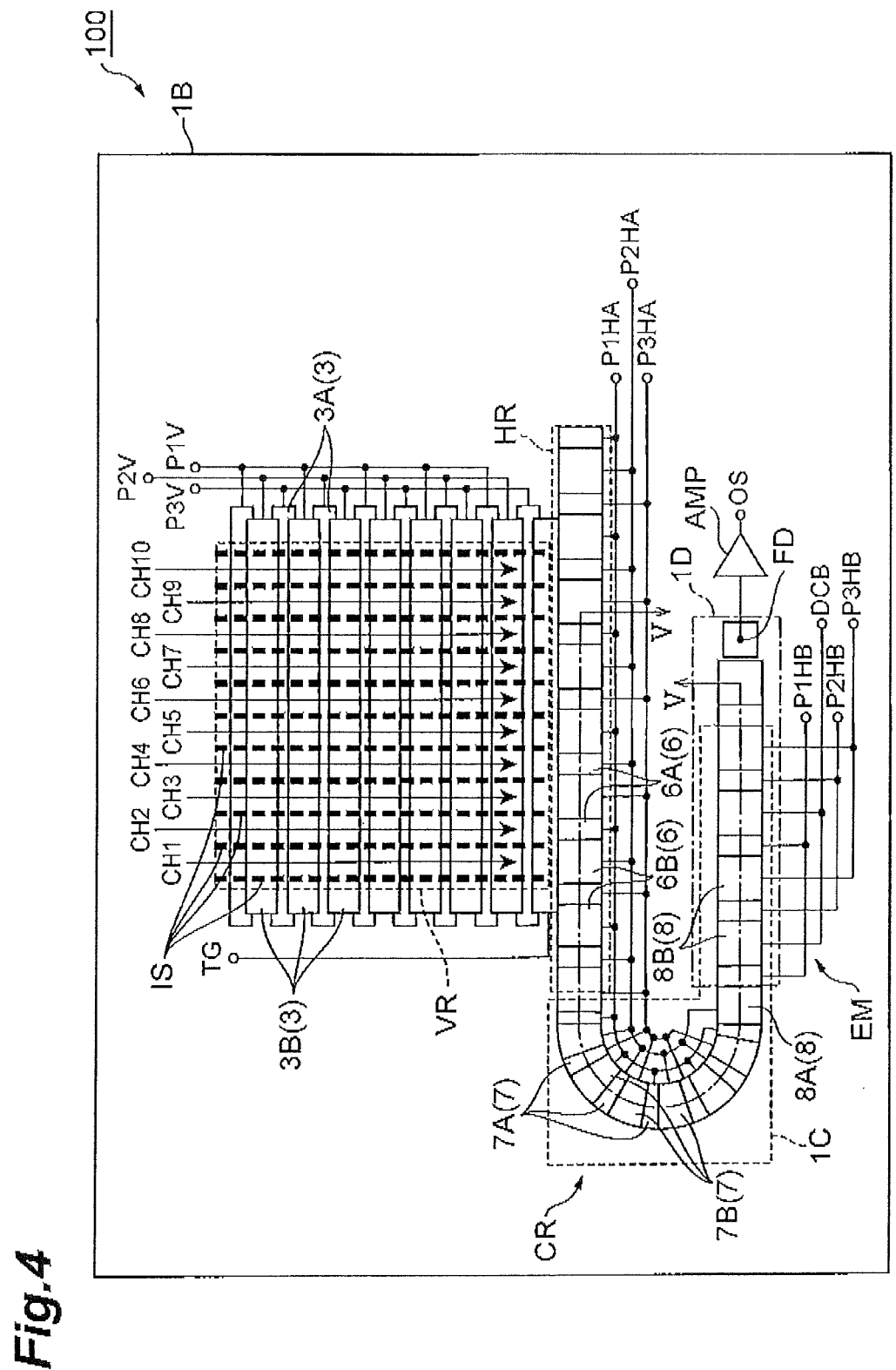
FIG. 4 is a plan view illustrating a detailed connection relation of the solid state imaging device.

FIG. 4 is a plan view illustrating a detailed connection relation of the solid state imaging device.

The imaging region VR includes the vertical transfer electrodes 3A and 3B that are arranged alternately in a vertical direction. Each of the transfer electrodes 3A and 3B extends in a horizontal direction, and adjacent transfer electrodes 3A and 3B have a slight overlap. In the present embodiment, a 3-phase driving voltage (P1V, P2V, and P3V) is applied to the transfer electrodes 3. Electrons that accumulate right below the transfer electrodes 3 are transferred in the vertical direction because of the application of the driving voltage to the transfer electrodes 3. A CCD of an FFT (Full Frame Transfer) scheme is shown in this figure. However, this CCD can be replaced with a CCD of an FT (Frame Transfer) scheme that further includes an accumulation region, or with a CCD of an IT (Interline Transfer) scheme.

The P-type isolations IS for separating each of vertical electric charge transfer channels CH1 to CH10 are formed in the imaging region VR. An electric charge generated in response to incidence of light in the channels CH1 to CH10 that constitute the imaging region VR is transferred in the vertical direction. The electric charge of each channel flows right below each of transfer electrodes 6 of the horizontal shift register BR.

A transfer electrode (transfer gate) to which a gate voltage TG is applied is provided between the imaging region VR and the horizontal shift register HR. An amount of electric charge that can flow in the horizontal shift register HR from the imaging region VR can be controlled by controlling the gate voltage TG.

Transfer electrodes 6A and 6B that constitute the horizontal shift register HR are arranged alternately in the horizontal direction. The transfer electrodes 6A and 6B have an overlapping portion. In any of the registers, the insulating layer 5 (see FIG. 5) that is formed on the insulating layer 2 is positioned between adjacent transfer electrodes 3A, 3B, 6A, 6B, 7A, 7B, 8A, and 8B. Thus, the adjacent transfer electrodes are electrically separated from each other. A 3-phase driving voltage (P1HA, P2HA, and P3HA) is applied to the transfer electrodes 6. Electrons right below the transfer electrodes 6 are transferred in the horizontal direction. The corner register CR that is bent in an arc-shape continues with the horizontal shift register HR. The transfer electrodes 7A and 7B that constitute the corner register CR are arranged alternately along the arc. The transfer electrodes 7A and 7B have an overlapping portion. A 3-phase driving voltage (P1HA, P2HA, and P3HA), which is the same as the driving voltage applied to the horizontal shift register HR, is applied to the transfer electrodes 7. Electrons right below the transfer electrodes 7 are transferred along the arc to the multiplication register EM.

In the multiplication register EM, the transfer electrodes 8A and 8B are arranged alternately in the horizontal direction. The transfer electrodes 8A and 8B have an overlapping portion. A 3-phase driving voltage (P1HB, P2HB, and P3HB) is applied to the transfer electrodes 8. Electrons right below the transfer electrodes 8 are transferred in the horizontal direction. Among four sets of the transfer electrodes 8, the driving voltage is applied to three sets of the transfer electrodes 8, and a direct-current electric potential DCB is applied to the remaining one set of the transfer electrodes 8 that are DC electrodes. In the present embodiment, when there are four sets of the transfer electrodes 8 that are arranged adjacent to each other in the horizontal direction, that is, when there are first, second, third, and fourth sets of the transfer electrodes 8, the set that is positioned second is taken as the DC electrodes and the direct-current electric potential DCB is applied to this.

A positive electric potential is applied to the transfer electrodes 8. An appropriate positive electric potential (P1HB) is applied to the first set of the transfer electrodes 8 thereby making a potential well deep (increase the electric potential: see FIG. 7) to accumulate electrons in this well. A high positive electric potential (a maximum value of P2HB>a maximum value of P2HA) is applied to the third set of the transfer electrodes 8 thereby making a potential well deep. A certain electric potential (DCB) applied to the second set of the transfer electrodes 8 is lower than these electric potentials (P1HB and P2HB). Thus, a potential barrier is formed between the first set and the third set of the transfer electrodes 8. In this state, when the potential well of the first set of the transfer electrodes 8 is made shallower (decrease electric potential: see FIG. 7), electrons overflow from this potential well, cross the barrier, and fall in the potential well (depth of potential well=ΦA) of the third set of the transfer electrodes 8. Electron multiplication is performed when the electrons fall. Subsequently, the potential of the first set of the transfer electrodes 8 is further decreased (upward direction) so that the accumulated electrons are completely transferred to the potential well of the third set of the transfer electrodes 8. The direction of the potential Φ is positive downward.

Then, by making the potential well right below the fourth set of the transfer electrodes 8 deeper and the potential well right below the third set of the transfer electrodes 8 shallower, the multiplied electrons can be moved in the potential well of the fourth set of the transfer electrodes 8. Similarly, by employing the same method that is used to perform the electric charge transfer from the third set of the transfer electrodes 8 to the fourth set of the transfer electrodes 8, the electrons that have accumulated in the potential well of the fourth set of the transfer electrodes 8 can be moved to the next set of the transfer electrodes 8, i.e., the first set of the transfer electrodes 8, and accumulated there. Thereafter, multiplication and transfer steps are repeated for the next set in the same manner as described above. Although a 3-phase driving is used in the present embodiment to perform electric charge transfer, it is possible to use a 4-phase driving or a 2-phase driving.

The multiplied electrons finally flow in a high-density N-type semiconductor region FD. The N-type semiconductor region FD is connected to the amplifier AMP. The amplifier AMP is a floating diffusion amplifier formed within the semiconductor substrate 1.

Figure 5:
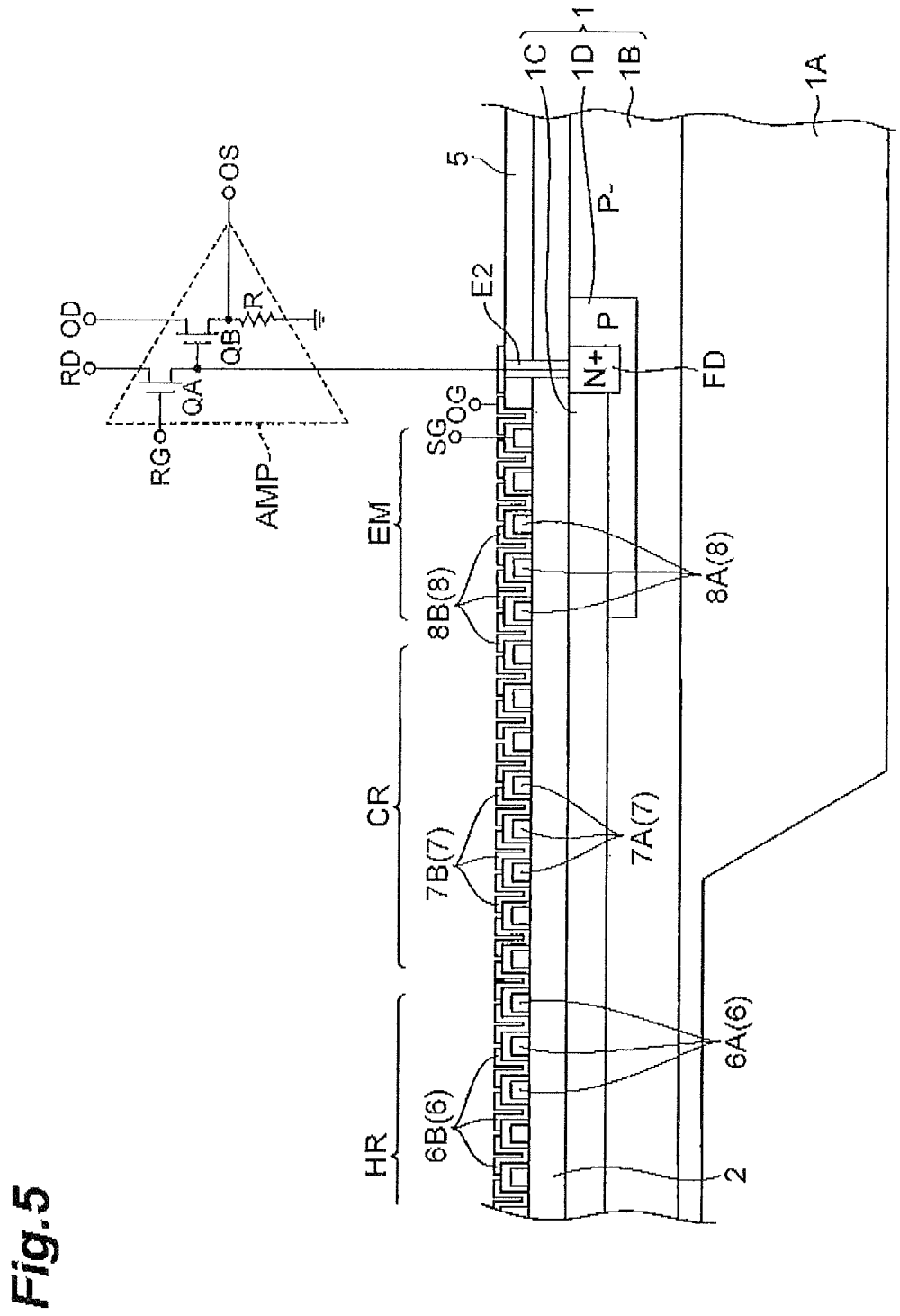
FIG. 5 is a sectional view of the solid state imaging device shown in FIG. 4 along arrows V-V.
Figure 6:
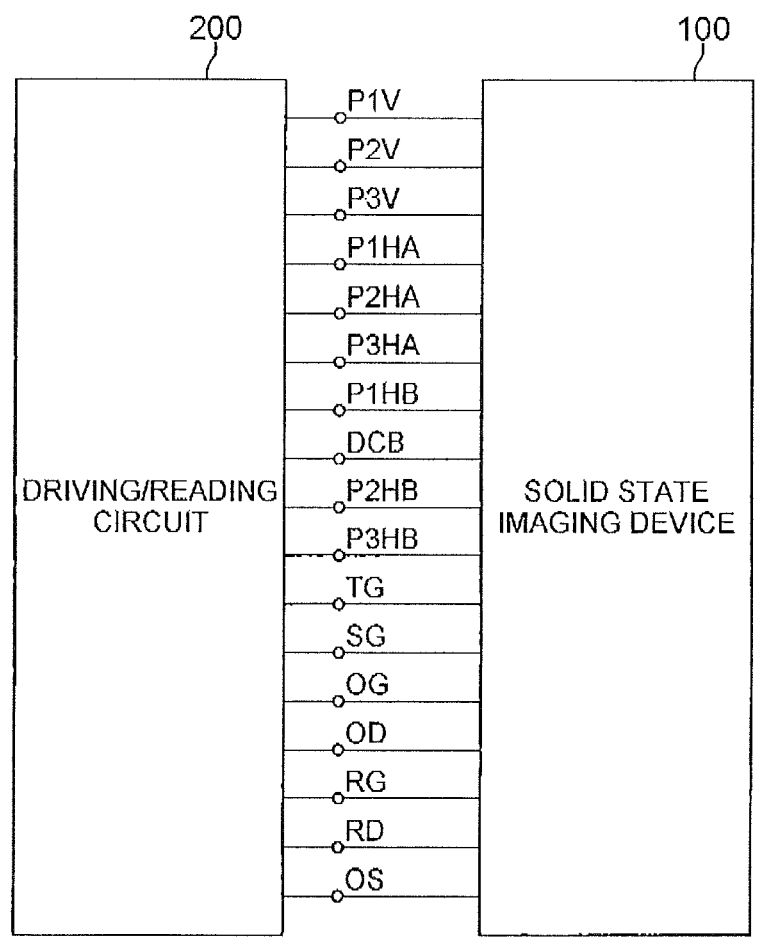
FIG. 6 is a block diagram illustrating a connection relation between a driving/reading circuit and the solid state imaging device.

FIG. 5 is a sectional view of the solid state imaging device shown in FIG. 4 along arrows V-V. FIG. 6 is a block diagram illustrating a connection relation between a driving/reading circuit 200 and the solid state imaging device 100. Various signals are supplied from the driving/reading circuit 200 to the solid state imaging device 100. To make the explanation of an electric charge reading unit simple, identical symbols are used for structural elements and signals.

A configuration of a signal reading unit is explained first. The amplifier AMP is connected to the semiconductor region FD of the signal reading unit. A gate electric potential of a transistor QB varies depending on an amount of electric charge in the semiconductor region FD, and in response to this, an amount of electric current flowing from an output drain OD through a resistor R via the transistor QB also varies. That is, a voltage OS (output voltage) between two terminals of the resistor R varies depending on the amount of electric charge accumulated in the semiconductor region FD, and this voltage OS is read.

A reset voltage RG is input to a reset gate RG after completion of reading of an electric charge from one pixel. Thus, the electric potential of the semiconductor region FD is reset via the reset drain RD. Because a potential of the reset drain RD is positive, in a reset operation, a potential well in which electrons can be accumulated is formed in the semiconductor region FD. After completion of the reset operation, the electric potential of the semiconductor region FD is set to a floating level by controlling the reset gate RG and turning off a transistor QA.

Before causing the electric charge to flow in the semiconductor region FD, an electric potential of a previous signal gate SG is increased to cause the electrons to accumulate there, and an electric potential of an output gate OG is fixed to form a barrier so that the electric charge does not flow from a region right below the signal gate SG to the semiconductor region FD. Thereafter, in the state that the electric potential of the output gate OG is fixed, when the electric potential of the signal gate SG is decreased, the electric charge accumulated right below the signal gate SG flows to the semiconductor region FD.

The multiplication register EM is explained next. The multiplication register EM is formed in the well region 1D, and it functions to multiply electrons from the horizontal shift register HR.

The epitaxial layer is known for its excellent crystalline property. Particularly, the crystalline property is better when impurity concentration is low. Therefore, when the N-type semiconductor region 1C is formed within the P-type epitaxial layer 1B, electron transfer is performed with a high accuracy because the electrons in each of the vertical shift register, the horizontal shift register HR, and the corner register CR are transferred within a semiconductor having an excellent crystalline property. The electrons transferred in this manner enter the semiconductor region 1C of the multiplication register EM. Furthermore, because the impurity concentration is low, a depletion layer can spread easily thereby increasing the sensitivity. Because the electrons generated in the depletion layer move because of a drift caused by an electric field, the electrons do not scatter because of diffusion, and the resolution improves.

The multiplication register EM includes the N-type semiconductor region 1C that is formed within the well region 1D, the insulating layer 2 formed on the semiconductor region 1C, a plurality of the transfer electrodes 8 formed adjacent to each other on the insulating layer 2, and the DC electrode 8 that is located between the transfer electrodes 8 and to which the direct current electric potential DCB (see FIGS. 4 and 7) is applied. There is the P-type well region 1D having a relatively higher density than the epitaxial layer 1B around the multiplication register EM. The epitaxial layer 1B is formed on the entire substrate. On the other hand, the N-type semiconductor region 1C is selectively formed only in the region in which are formed the imaging region VR, the horizontal shift register HR, the corner register CR, and the multiplication register EM.

Figure 7:
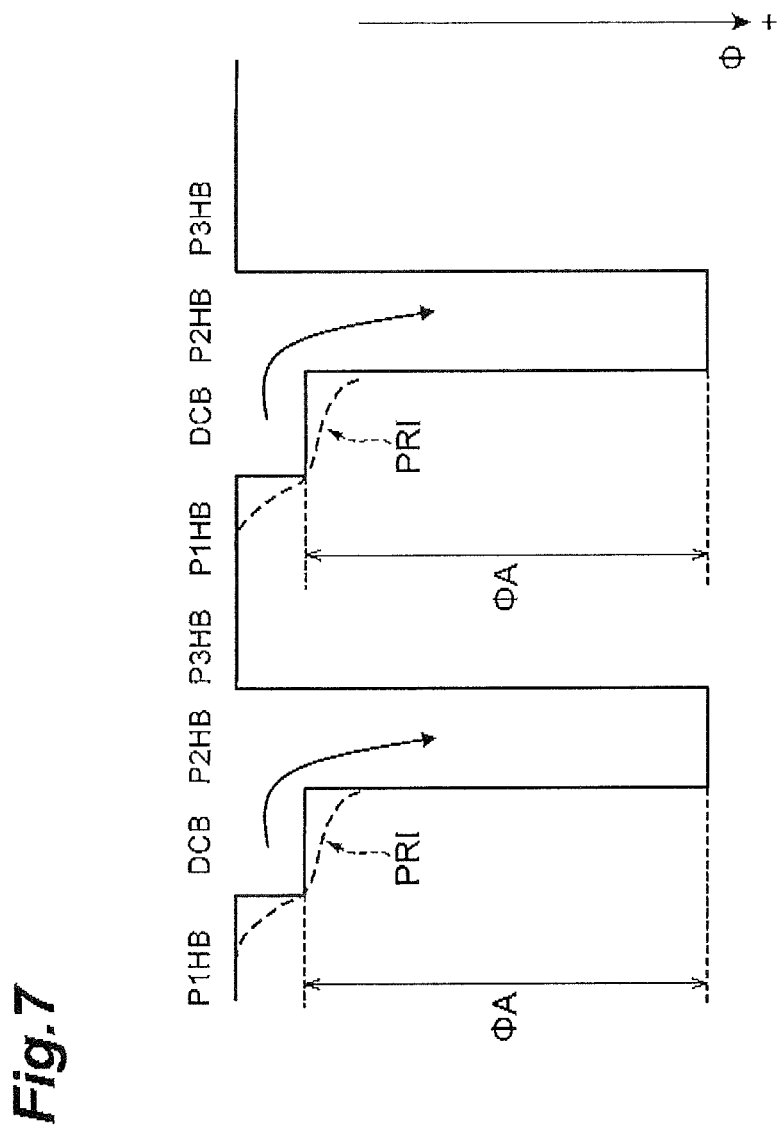
FIG. 7 is a potential diagram of a multiplication register.

FIG. 7 is a potential diagram of a multiplication register.

In the above structure, as shown in this figure, the degree of electron multiplication increases significantly because there takes place a precipitous electric potential change right below the transfer electrodes 8 of the multiplication register EM. In other words, because a precipitous electric potential change takes place in the N-type semiconductor region 1C between the DC electrodes 8 to which the direct-current electric potential DCB is applied and next-stage transfer electrodes (multiplication electrodes) 8 to which the electric potential P2HB is applied, excellent electron multiplication is performed.

Electron multiplication is performed when the electrons flow from the potential well (electric potential P1HB) of the first set of the transfer electrodes to the potential well (electric potential P2HB) of the third set of the transfer electrodes after crossing the potential well of the second set of the transfer electrodes to which the direct-current electric potential DCB is applied. If it is assumed that the P-type well region 1D (see FIG. 5) is absent, as shown with a dotted line PRI in the same figure, the potential change becomes slow so that sufficient electron multiplication cannot be performed. When the epitaxial layer with a high electric resistance is used, practically no electron multiplication is performed when the P-type well region 1D is absent, and the degree of electron multiplication is 1.01 or more per step when the P-type well region 1D is present.

Preferable ranges of an impurity concentration $C_P$ of the P-type semiconductor layer and an impurity concentration $C_N$ of the N-type semiconductor layer are as follows:

Impurity concentration $C_P(1A)$ of the P-type semiconductor substrate $1A = 1 \times 10^{17}$ to $1 \times 10^{19}/cm^3$ Impurity concentration $C_P(1B)$ of the P-type epitaxial layer $1B = 1 \times 10^{11}$ to $1 \times 10^{16}/cm^3$ Impurity concentration $C_N(1C)$ of the N-type semiconductor region $1C = 1 \times 10^{12}$ to $1 \times 10^{17}/cm^3$ Impurity concentration $C_P(1D)$ of the P-type well region $1D = 1 \times 10^{12}$ to $1 \times 10^{17}/cm^3$ An impurity concentration C satisfies the following relations:

$$C_P(1A) > C_N(1C) > C_P(1B)$$

$$C_P(1A) > C_P(1D) > C_P(1B)$$

A thickness t (1A) of the P-type semiconductor substrate 1A, a thickness t (1B) of the P-type epitaxial layer 1B, a thickness t (1C) of the N-type semiconductor region 1C, and a thickness t (1D) of the P-type well region 1D satisfy the following relation:

$$t(1A) > t(1B) > t(1D) > t(1C)$$

The material of the semiconductor is Si, and a specific resistance of the P-type epitaxial layer in the present embodiment is 100 Ωcm. Thus, the specific resistance is higher than the commonly used 10 Ωcm.

The material of the insulating layer 2 is explained next.

Figure 8:
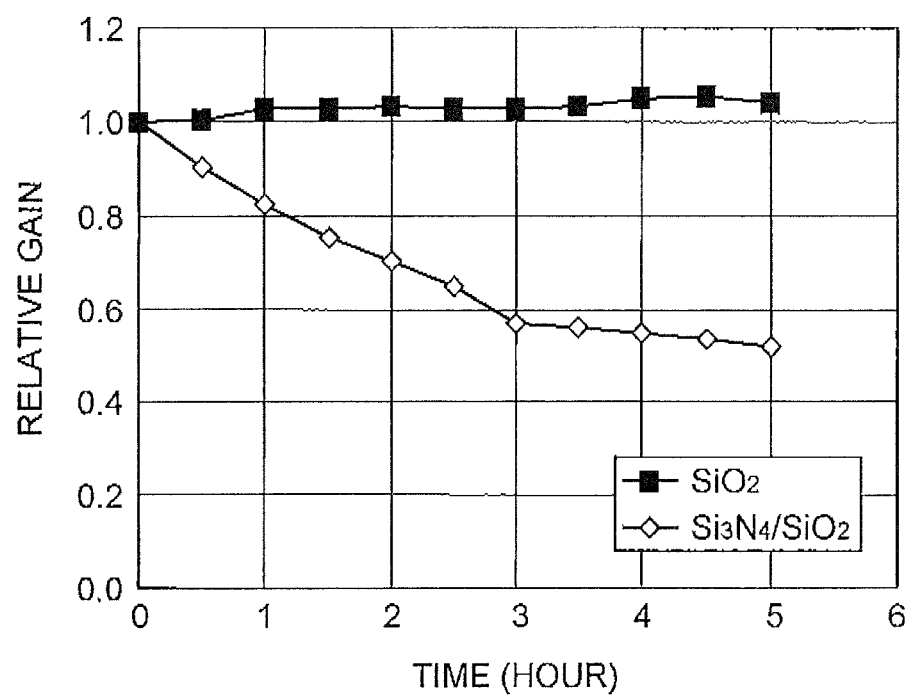
FIG. 8 is a graph showing a relationship between a time for which the solid state imaging device is used and a relative gain.

FIG. 8 is a graph showing a relationship between a time for which the solid state imaging device is used and a relative gain.

The insulating layer 2 according to the embodiment shown in FIG. 5 is a single $SiO_2$ layer. As an insulating layer of a comparative example, a two-layer insulating layer including an $Si_3N_4$ layer and an $SiO_2$ layer was used. Comparison is performed between the single-layer insulating layer with the single $SiO_2$ layer and the two-layer insulating layer with the $Si_3N_4$ layer and the $SiO_2$ layer of the same thicknesses. The $SiO_2$ layer is a thermally-oxidized film of Si. Furthermore, the $Si_3N_4$ layer is formed with an LPCVD method. Material of the transfer electrodes is P-doped polysilicon.

In case of the insulating layer of the comparative example, a relative gain of a multiplication register gradually decreased along with the passage of imaging time. On the other hand, according to the embodiment in which the insulating layer 2 is a single $SiO_2$ layer, an unexpected result that the gain did not decrease even after a passage of 5 hours was obtained.

To address this phenomenon, it is presumed that, when the insulating layer has a two-layer structure, an electric charge is trapped at a boundary between the $Si_3N_4$ layer and the $SiO_2$ layer, and the trapped electric charge produces an adverse effect on the characteristics of the multiplication register EM.

INDUSTRIAL APPLICABILITY

The present invention is applicable to the solid state imaging device with the electron multiplying function that enables imaging of a very weak optical image by performing electron multiplication with high-performance.

The above embodiment can be applied, without etching the semiconductor substrate, to a front-surface illuminated solid state imaging device.

REFERENCE SIGNS LIST

1A Semiconductor substrate, 1B . . . Epitaxial layer, VR . . . Imaging region, 1C . . . N-type semiconductor region, HR . . . Horizontal shift register, 1D . . . P-type well region, EM . . . Multiplication register.

The invention claimed is:

1. A solid state imaging device with an electron multiplying function comprising:
   a P-type semiconductor substrate;
   a first P-type epitaxial well layer on the semiconductor substrate;
   an imaging region formed within and in contact with the first P-type epitaxial well layer that serves as a potential well for the imaging region;
   a horizontal shift register that includes an N-type semiconductor region formed within the first P-type epitaxial well layer and that transmits a signal from the imaging region;
   a second P-type well region formed within the first P-type epitaxial well layer; and
   a multiplication register that multiplies electrons from the horizontal shift register, the multiplication register formed within and in contact with the second P-type well region that serves as a potential well for the multiplication register, wherein the N-type semiconductor region extends in the second P-type well region, and a P-type impurity concentration in the second P-type well region is higher than a P-type impurity concentration in the first P-type epitaxial well layer.

2. The solid state imaging device with the electron multiplying function according to claim 1, wherein the multiplication register includes the N-type semiconductor region formed within the well region;

an insulating layer formed on the semiconductor region;

a plurality of transfer electrodes formed adjacent to each other on the insulating layer; and a DC electrode that is arranged between the transfer electrodes and to which a direct-current electric potential is applied.

3. The solid state imaging device with the electron multiplying function according to claim 2, wherein the insulating layer includes only a single $SiO_2$ layer.

4. The solid state imaging device with the electron multiplying function according to claim 1, further comprising:

a corner register for transferring charges from the horizontal shift register to the multiplication register, the corner register having an arc-shape such that the multiplication register is arranged in parallel with the horizontal shift register, but a charge transfer direction of the multiplication register is opposite to a charge transfer direction of the horizontal shift register.

5. The solid state imaging device with the electron multiplying function according to claim 1, wherein the multiplication register is arranged to be surrounded by the well region.

6. The solid state imaging device with the electron multiplying function according to claim 1, wherein the second P-type well region is not formed in an area of the imaging region and the horizontal shift register.

* * * * *